United States Patent
Lee

(10) Patent No.: US 6,202,185 B1
(45) Date of Patent: Mar. 13, 2001

(54) METHODS AND APPARATUS FOR FACILITATING SCAN TESTING OF CIRCUITRY

(75) Inventor: Andy L. Lee, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/169,177

(22) Filed: Oct. 8, 1998

Related U.S. Application Data

(60) Provisional application No. 60/062,078, filed on Oct. 15, 1997.

(51) Int. Cl.[7] .................................................. G01R 31/28
(52) U.S. Cl. ........................ 714/726; 714/729; 714/736; 324/73.1; 324/537; 324/763
(58) Field of Search ..................... 714/724–729, 714/731, 734, 736; 324/73.1, 537, 763

(56) References Cited

U.S. PATENT DOCUMENTS

| | | | |
|---|---|---|---|
| 4,856,002 | * | 8/1989 | Sakashita et al. ................... 714/731 |
| 4,864,579 | * | 9/1989 | Kishida et al. ...................... 714/726 |
| 5,008,618 | * | 4/1991 | Van Der Star ...................... 714/729 |
| 5,047,710 | * | 9/1991 | Mahoney ............................ 324/537 |
| 5,166,604 | | 11/1992 | Ahanin et al. ...................... 324/763 |

* cited by examiner

Primary Examiner—Emmanuel L. Moise
(74) Attorney, Agent, or Firm—Fish & Neave; Robert R. Jackson; Walter M. Egbert, III

(57) ABSTRACT

Scan testing of logic circuitry is facilitated by providing register circuits, each having an input gate configured to selectively pass a data s signal applied to that register, a master stage configured to store a data signal passed by the input gate of that register, an interstage gate configured to selectively pass a data signal stored by the master stage of that register, and a slave stage configured to store a data signal passed by the interstage gate of that register. Inter-register gates are operatively arranged to selectively pass a data signal stored by the master stage of an associated respective first one of the registers to the master stage of an associated respective second one of the registers for storage by the master stage of that second one of the registers. During normal operation, circuitry is configured to alternately enable the input gates and the interstage gates, and to disable the inter-register gates. During a scan mode, circuitry is configured to disable the input gates and the interstage gates, and to alternately enable alternate ones of the inter-register gates.

20 Claims, 7 Drawing Sheets

METHODS AND APPARATUS FOR FACILITATING SCAN TESTING OF CIRCUITRY

CROSS-REFERENCE TO RELATED APPLICATIONS

This application claims the benefit of U.S. provisional patent application Ser. No. 60/062,078, filed Oct. 15, 1997.

BACKGROUND OF THE INVENTION

This invention relates to testing circuitry, and more particularly to methods and apparatus for facilitating the scan testing of such circuitry.

Scan testing is a well-known technique for testing circuitry to determine whether or not the circuitry has been properly designed to function as required under all operating conditions, and also to determine whether the circuit itself has been fabricated properly and without defects. In some designs, scan registers are added in addition to the actual logic registers to implement the scan chain. For those designs, the actual logic registers are not used in the scan chain and are thus not affected.

In other cases, the logic registers, themselves, are used for scanning out data. In this case, the logic registers serve as logic registers in normal operation. However, during scan testing, these same registers are used to shift their stored values along the scan chain. This latter case reduces hardware in the circuit because dedicated scan registers do not need to be added.

As a consequence of using the same registers for both normal operation and scan testing, the output of these registers toggles with scan data during the scanout procedure. If these same outputs drive bistable circuits (e.g., J-K flip-flops), the toggling of the register output could change the state of the bistable. Therefore, even if the scan register data is scanned back into the device, the original state of the machine is lost. It is because of the loss of state that this type of scanout is destructive. Therefore, using the prior art technique, it is not possible to stop a circuit, scan out its register contents, and then continue on where the circuit was stopped. Instead, the circuit has to be re-initialized and its input pattern rerun.

In view of the foregoing, it is an object of this invention to provide improved methods and apparatus for scan testing circuits.

It is another object of this invention to make it possible for normal operation of a circuit to be stopped, to have the data scanned out, and then to have the original state recovered so that the circuit can continue running from the point just before scan testing began.

SUMMARY OF THE INVENTION

These and other objects of the invention are accomplished by providing circuitry having register circuits, each having an input gate configured to selectively pass a data signal applied to that register, and a master stage configured to store a data signal passed by the input gate of that register. Each register circuit has an interstage gate configured to selectively pass a data signal stored by the master stage of that register, and a slave stage configured to store a data signal passed by the interstage gate of that register. Inter-register gates are operatively arranged to selectively pass a data signal stored by the master stage of an associated respective first one of the registers to the master stage of an associated respective second one of the registers for storage by the master stage of that second one of the registers. The master stages of all of the registers and the inter-register gates are connected in a series of alternating master stages and inter-register gates.

Normal mode circuitry is configured to alternately enable the input gates and the interstage gates of each register. This enables the contents of each master stage to be stored by the associated slave stage. Normal mode circuitry also disables the inter-register gates, which are not used during normal operation. Scan mode circuitry is configured to disable the input gates and the interstage gates to preserve the outputs of all register slave stages of the circuit during scanout. Alternate ones of the inter-register gates are enabled by the scan mode circuitry.

In a preferred embodiment, a feedback gate is configured to selectively pass a data signal stored by the slave stage of each of the registers to the master stage of that register for storage by that master stage. The scan mode circuitry is further configured to enable the feedback gates while disabling the input gates, the interstage gates, and the inter-register gates. In a preferred embodiment, restoration mode circuitry is configured to selectively enable one of the input gates and the feedback gates and to disable the interstage gates and the inter-register gates. The selection between the input gates and the feedback gates may be based on the phase of a clock signal.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
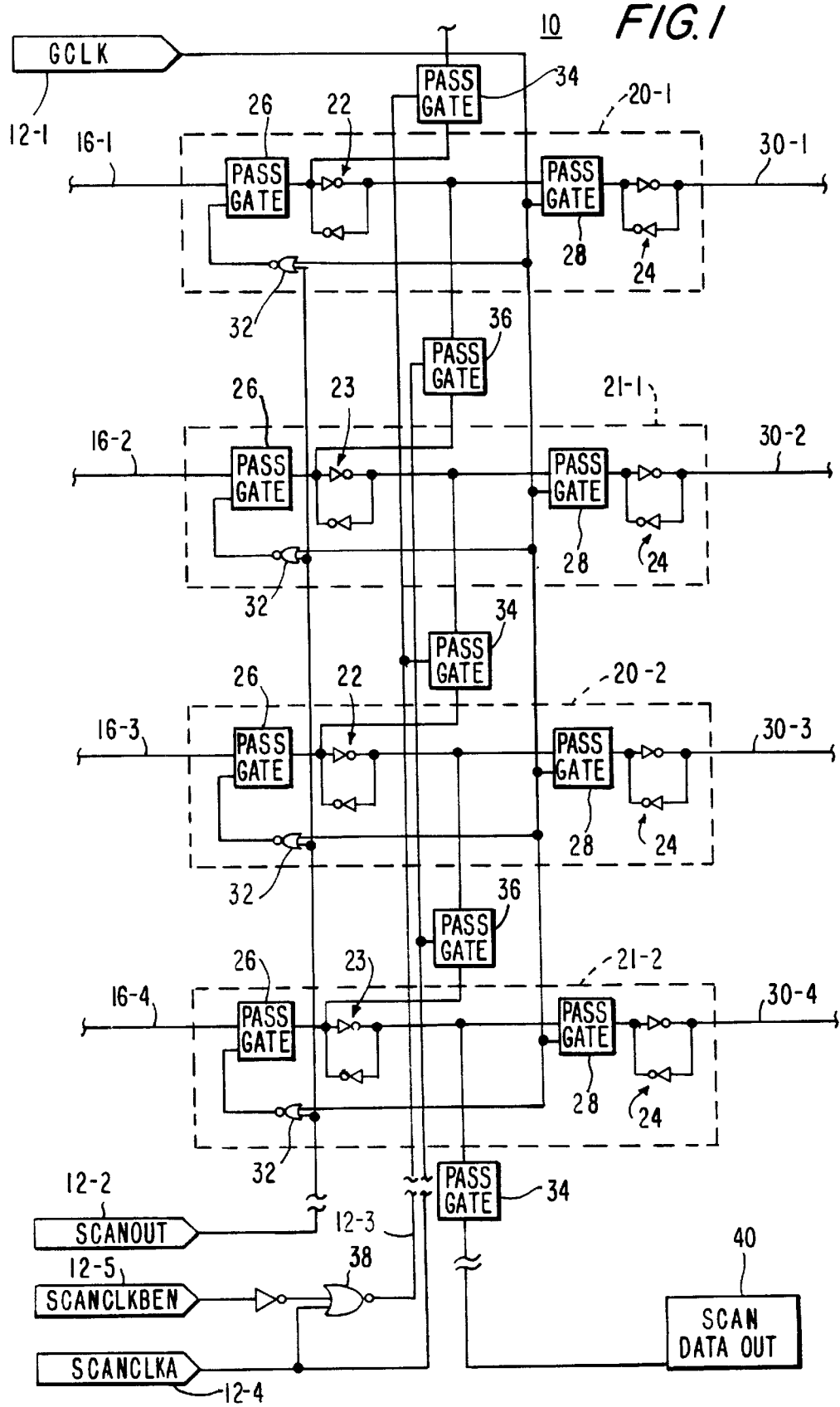
FIG. 1 is a schematic block diagram of a representative portion of circuitry including elements in accordance with this invention for facilitating scan testing of that circuitry.
Figure 2:
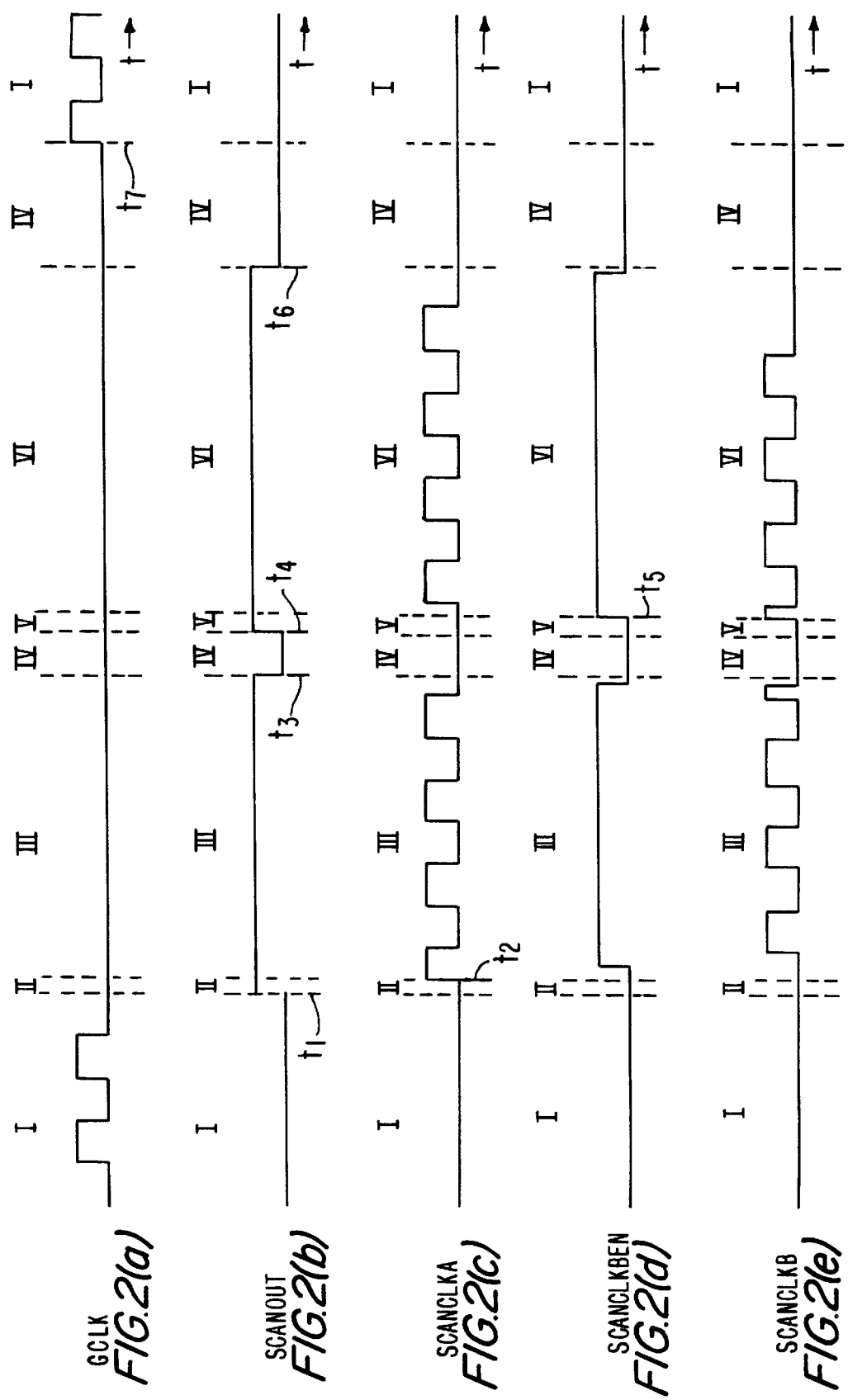
FIG. 2a is a time plot of a control signal sequence in accordance with the invention.
FIG. 2b is a time plot of another control signal sequence in accordance with the invention.
FIG. 2c is a time plot of yet another control signal sequence in accordance with the invention.
FIG. 2d is a time plot of an additional control signal sequence in accordance with the invention.
FIG. 2e is a time plot of another control signal sequence in accordance with the invention.

FIG. 1 illustrates a circuit schematic in accordance with the present invention. In the description which follows, reference is made to "normal operation", which refers to the mode of operation for which the circuit was designed. "Scanout" or "scan" will refer to the test mode in which normal operation is suspended to enable the detection of the states of logical elements (especially registers, i.e., flip-flops) within the circuit.

The circuit elements shown may represent a portion of an integrated digital circuit containing several circuit elements. Four register circuits, i.e., flip-flops 20-1, 21-1, 20-2 and 21-2 have been represented in the FIG., although it is contemplated that any number of register circuits may be used depending upon the application. (Reference numbers 20 and 21 are used for convenience in the description below, although flip-flops 20 and flip-flops 21 are all substantially identical.) Each of flip-flops 20/21 is part of the normal logic of circuitry 10 which is to be tested, generally along with other normal logic (not shown) which generates the data signals 16-1 through 16-n normally applied to the data input terminals of flip-flops 20/21, and/or which uses the registered output signals 30-1 through 30-n of those flip-flops.

In the embodiment shown in FIG. 1, the flip-flops are rising-edge triggered. Each flip-flop contains a master stage 22/23, followed by a slave stage 24. An input pass gate 26 is provided at the input to each master stage 22/23, and an interstage pass gate 28 is provided between each master stage 22/23 and the associated slave stage 24. (As with flip-flops 20/21 above, master stages 22 and master stages 23 are substantially identical. For purposes of the description, master stages 22 are associated with flip-flops 20, and master stages 23 are associated with flip-flops 21.)

A global clock signal GCLK 12-1 is provided to the circuit and regulates the function of pass gates 26 and 28. GCLK 12-1 is fed to each pass gate 28 and serves as the first of the two inputs to each NOR gate 32. During normal operation, the second input SCANOUT 12-2 is low. (SCANOUT, which initiates the scan procedure, will be described in greater detail below.) The NOR gate thus functions effectively as an inverter to GCLK 12-1. The output of each NOR gate 32 is fed to each pass gate 26. Consequently, the GCLK-related signals to pass gates 26 and 28 are of different polarity during normal operation. If pass gate 26 is enabled by the inverted GCLK signal, then pass gate 28 is disabled by the non-inverted GCLK signal. Conversely, when pass gate 26 is disabled by the inverted GCLK signal, pass gate 28 is enabled by the non-inverted GCLK signal, i.e., pass gates 26 and 28 are alternately enabled. This makes possible the initial reception of input 16 by each master stage 22/23, and the subsequent transfer of the state of master stage 22/23 to the associated slave stage 24 after GCLK 12-1 is toggled.

The global signal SCANOUT 12-2 is used to initiate the scanout mode, during which mode GCLK is held low. During the non-destructive scanout process, SCANOUT 12-2 is high. Consequently, when SCANOUT is high, all pass gates 26 are disabled because the SCANOUT signal is fed into each NOR gate 32, as described above. The outputs from any elements on 16-1 through 16-n are thereby cut off and not passed on to flip-flops 20/21.

Additional structure is provided to facilitate the non-destructive scanout process. An inter-register pass gate 34/36 is provided between master stages of adjacent flip-flops 20/21. More particularly, a scan chain is formed as a series of master stages and pass gates 34 alternating with pass gates 36 between adjacent master stages. Pass gates 34 and 36 may be a CMOS pass gate, or an NMOS transistor, or equivalent structure known in the art. As FIG. 1 illustrates, pass gates 34 are activated by clocking signal SCANCLKB 12-3, while pass gates 36 are activated by clocking signal SCANCLKA 12-4. This permits master stages 22/23 to be coupled in pairs, as will be described in greater detail below.

Clocking signal SCANCLKB 12-3 is derived from SCANCLKA 12-4 and a second global signal SCANCLK-BEN 125. SCANCLKBEN 12-5 is inverted, and along with SCANCLKA 12-4, serves as the two inputs to NOR gate 38. Thus, when SCANCLKBEN 12-5 is low, SCANCLKB will be low also. When SCANCLKBEN is high, SCANCLKA and SCANCLKB will be of opposite polarity.

When it is desired to enter the scan mode, GCLK is held low, and SCANOUT is held high. Register data may then be read out by coupling the master stages of adjacent flip-flops 20/21 with inter-register gates 34/36. The coupling process is achieved by alternately enabling and disabling pass gates 34 and 36 in response to SCANCLKA and SCANCLKB. First, the contents of master stages 22 of the flip-flops 20 of each coupled pair are passed down to the scan output at the bottom of the chain to SCAN DATA OUT 40. The original state of each of the flip-flops 20/21 may then be restored by enabling the pass gate 26 associated with each master stage 22/23. This is achieved by toggling the SCANOUT signal 12-2 to the low logical state, or condition. Subsequently, SCANOUT is returned to high and adjacent flip-flops are re-coupled such that each flip-flop 21 is now the first of each pair, and the contents of the master stages 23 of flip-flops 21 are scanned out, as will be described in greater detail below.

Lastly, the original state of each of the flip-flops 20/21 can be restored again by toggling the SCANOUT signal 12-2 to the low condition, thereby enabling the pass gate 26 associated with each master stage 22/23. Normal operation of the circuit can then be resumed.

In the foregoing discussion, the original states of flip-flops 20/21 are restored each time pass gates 26 are enabled because all inputs to circuit 10 (other than the scan control signals) are assumed to be held constant during the scan process, and because the contents of the slave stages 24 of all flip-flops in circuit 10 are undisturbed by the scan process (pass gates 28 all being disabled during the scan process). Thus, no matter what the source of each of inputs 16 (i.e., whether an input 16 is derived from one or more inputs to circuit 10 and/or from one or more flip-flop outputs 30 in circuit 10), each input 16 remains constant throughout the scan process and available to restore the master stage of the associated flip-flop 20/21 to its pre-scan state whenever pass gates 26 are enabled.

Operation of the Apparatus

The non-destructive scan procedure will now be described in greater detail with respect to an illustrative sequence of timing signals illustrated in FIGS. 2a–2e, in conjunction with FIG. 1. It is contemplated that other timing sequences may be performed to conduct the scan procedure. FIGS. 2a–2e are aligned such that signals represented in the FIGS. in the same horizontal position occur simultaneously. The duration of the various clock pulses and signals are not shown to scale and may have whatever duration is deemed appropriate to one skilled in the art.

Normal operation is indicated in stage I of FIGS. 2a–2e. During normal operation, the global clock function is supplied by GCLK 12-1. Flip-flops 20/21 operate with the adjoining circuit elements as normal. Furthermore, SCANOUT 12-2 is low (FIG. 2b). As a result, NOR gates 32 operate as inverters on the GCLK signal. The SCANCLKBEN (FIG. 2d) and SCANCLKA (FIG. 2c) signals are also low. Consequently, the pass gates 34 and 36 between adjacent master stages are disabled.

The initiation of scan testing is represented at stage II of FIGS. 2a–2e. GCLK is low such that normal operation is suspended. SCANOUT 12-2 is toggled to the high condition at time t1 (FIG. 2b). Consequently, both pass gates 26 and 28 are disabled for all flip-flops 20/21. As long as all the master and slave latches are disabled, the outputs 30 of all registers 20/21 remain static, and as a result the inputs 16 to all registers will remain static (again assuming that all inputs to circuit 10 (other than scan control inputs) are held constant).

Subsequently, the scanout procedure for flip-flops 20-1 through 20-n is commenced as indicated in stage III of FIGS. 2a–2e. During this stage two adjacent flop-flips 20/21 form a pair in order to scan data from the first flip-flop 20 of each pair down to the bottom of the chain. As shown in the FIGS., this process is initiated by toggling SCANCLKA high, starting at time t2 (FIG. 2c) before SCANCLKBEN is toggled to the high condition. As a result, the state of master stage 22 of the first flip-flop 20 of each pair is passed to the master stage 23 of the second flip-flop 21 of the pair. Thus, the contents of the master stage 23 of each flip-flop 21 is overwritten by the master stage 22 of each flip-flop 20. In effect, master stage 23 of flip-flop 21 temporarily acts as a slave stage to master stage 22 of flip-flop 20.

As indicated in stage III of FIGS. 2a–2e, SCANCLKA is toggled while SCANCLKBEN remains high. As SCANCLKA is toggled, data from flip-flops 20 is passed vertically downward. This data may be scanned out (via element 40) at the bottom of the chain (see FIG. 1).

The next step in the non-destructive scanout procedure is the recovery of the initial state as illustrated in stage IV in FIGS. 2a–2e. Global clock GCLK remains low during this stage (FIG. 2a). Since no data is being scanned out, SCANCLKA and SCANCLKBEN are both low. SCANOUT is toggled from high to low at time t3 (FIG. 2b). Deasserting SCANOUT enables all pass gates 26 to be enabled. Consequently, the initial state of all master stages 22/23 is recovered.

The scanout procedure for flip-flops 21-1 through 21-n is now initiated as indicated in stage V of FIGS. 2a–2e. During this stage, flip-flops 20/21 are again paired. However, master stage 22 of each flip-flop 20 temporarily acts as a slave stage to master stage 23 of each flip-flop 21 to permit scanning of data from the master stages 23 of flip-flops 21. SCANOUT is toggled back from low to high to disable pass gates 26 at time t4 (FIG. 2b).

To begin scanout at stage VI, SCANCLKBEN is asserted at time t5 before SCANCLKA (FIG. 2d), in contrast with scanout at stage III, described above. As a result, data in the master stage 23 of each first flip-flop 21 in the pair of flip-flops 20/21 is passed to the master stage 22 of the second flip-flop 20 of the pair. Thus, the contents of the master stage 22 of flip-flop 20 are overwritten by the master stage 23 of flip-flop 21. As in stage III, described above, SCANCLKA is toggled while SCANCLKBEN remains high. As SCANCLKA is toggled, data from flip-flops 21 is passed vertically downward. This data may be scanned out at the bottom of the chain.

The recovery stage, again referred to as stage IV in FIGS. 2a–2e, recovers the initial state of the machine during normal operation in stage I prior to commencement of the scanout process. Once the data from flip-flops 21 have been scanned out, SCANCLKA and SCANCLKBEN remain in the low condition. The initial state is recovered by toggling SCANOUT from the high to the low condition at time t6 (FIG. 2b). Consequently, pass gates 26 are re-enabled. Once the initial state is recovered, the normal operation (stage I) may continue, as indicated by the resumption of the global clock GCLK signal at time t7 (FIG. 2a).

A Second Embodiment of the Apparatus and Method

Figure 3:
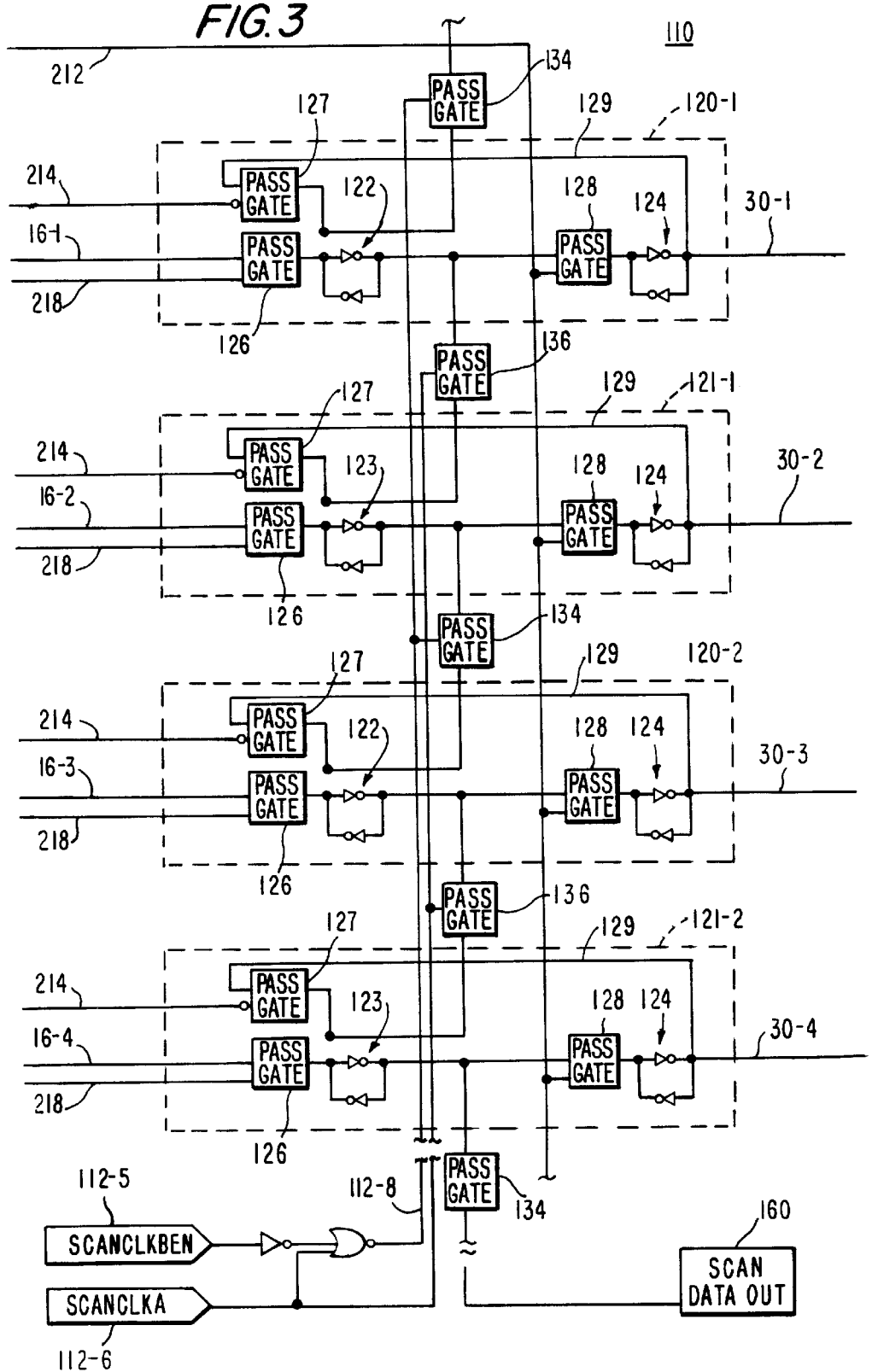
FIG. 3 is a schematic block diagram of a representative portion of circuitry in accordance with another embodiment of the subject invention.
Figure 4:
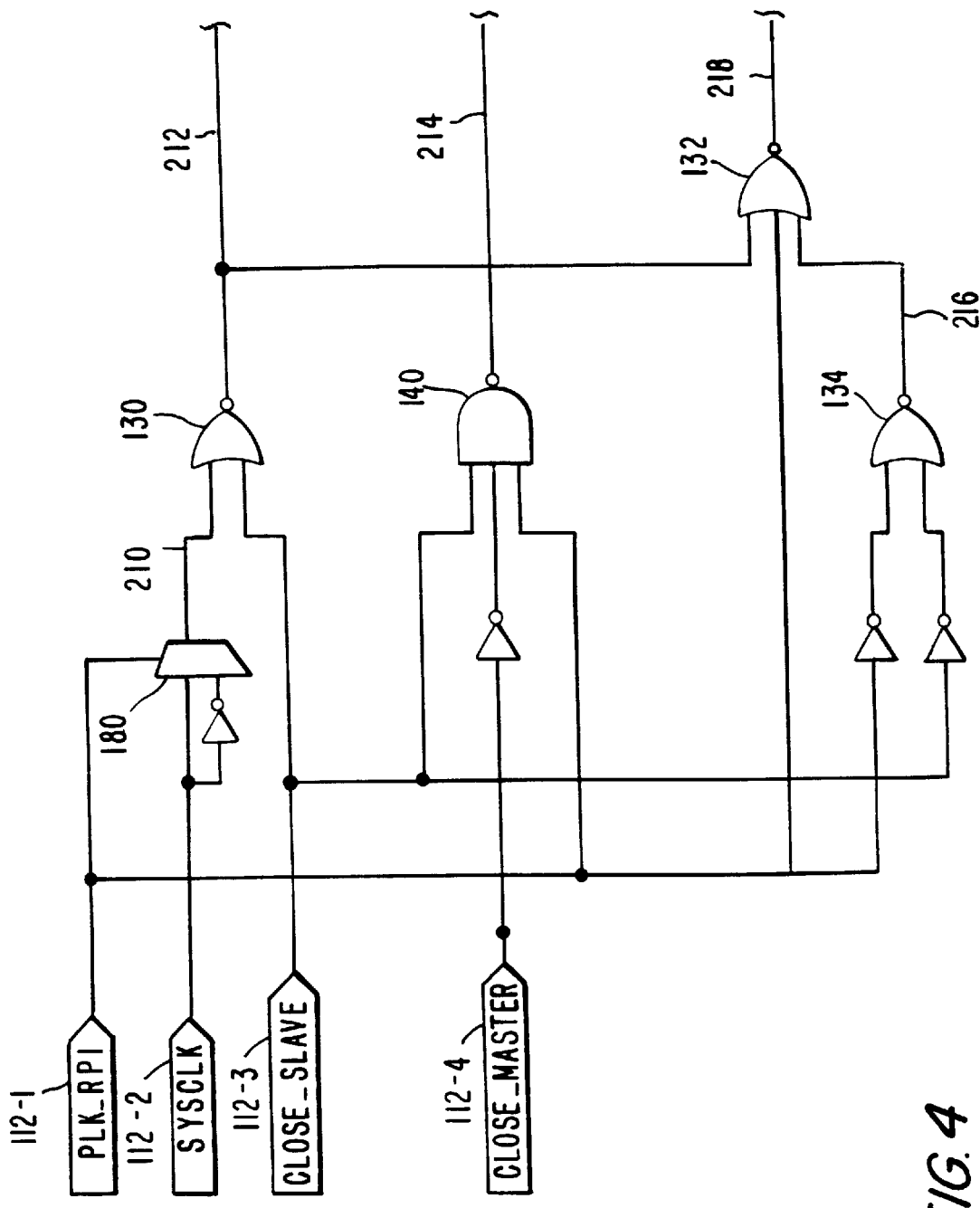
FIG. 4 is a schematic block diagram illustrating another portion of the embodiment of FIG. 3.

FIGS. 3–4 illustrate another embodiment in accordance with the subject invention. This embodiment is substantially identical to the circuitry disclosed above with respect to FIG. 1, with the differences described below. As with the circuitry described above, the embodiment of FIGS. 3–4 permits the scan testing of logical elements within the circuit, and the subsequent restoration of the states of these elements so that normal operation may resume without re-initialization. It is contemplated that the invention may be used with both rising-edge activated and trailing-edge activated flip-flops. The invention provides the ability to restore the states of the flip-flops, regardless of the phase of the clock when normal operation was suspended. The clock signal, as will be described for the exemplary embodiment, corresponds to signal 212.

As illustrated in FIG. 3, each flip-flop 120/121 includes a master stage 122/123 and a slave stage 124. During normal operation, the master stage receives data signals from the circuitry as inputs. Thereafter, the contents of the slave stage are overwritten with the contents of the master stage. Normal operation is suspended to initiate the scanout procedure. Depending upon the polarity of the clock signal when normal operation is stopped, the slave stage may or may not have yet been over-written. Therefore, the process of restoring the state of the flip-flop will vary according to the polarity of the clock signal at which normal operation was suspended. Accordingly, flip-flops 120/121 as illustrated in FIG. 3 are structured so that the state of each master stage may be restored regardless of when normal operation was suspended. Thus, the master stage may be restored from the input 16-n to the master stage, which is substantially similar to the restoration process described above with respect to FIGS. 2a–2e. Alternatively, restoration may occur from the slave stage itself, as will be described in greater detail below.

The circuit elements shown in FIG. 3 may represent a portion of an integrated digital circuit containing several circuit elements. Four flip-flops 120-1, 121-1, 120-2 and 121-2 have been represented in the FIG., although it is contemplated that any number of flip-flops may be used depending upon the application. (As with FIG. 1, described above, flip-flops 120 and flip-flops 121 are all substantially identical.) Each of flip-flops 120/121 is part of the normal logic of circuitry 110 which is to be tested, generally along with other normal logic (not shown) which generates the data signals 16-1 through 16-n normally applied to the data input terminals of flip-flops 120/121, and/or which uses the registered output signals 30-1 through 30-n of those flip-flops as in FIG. 1, described above.

Each flip-flop contains a master stage 122/123, followed by a slave stage 124. Input pass gate 126 is provided at the input to each master stage 122/123 from data signals 16-n. Interstage pass gate 128 is provided at the input to each slave stage 124 from the output of each master stage 122/123. Feedback pass gate 127 is provided on signal path 129 which extends from the output of slave stage 124 to the input of master stage 122/123. In the preferred embodiment, pass gates 126 and 128 respond to a high signal to become enabled, and a low signal to become disabled. In contrast, pass gate 127 responds to a low signal to become enabled, and a high signal to become disabled. As illustrated in FIG. 3, signal 218 controls pass gates 126, and signal 214 governs pass gates 127. Signal 212 controls pass gates 128 and functions as a clock signal substantially as described for GCLK 12-1 with respect to FIGS. 1–2, above, with the differences noted below.

During normal operation, pass gates 126 and 128 govern the signal flow through flip-flops 120/121. Pass gate 126 is enabled during a low clock phase for signal 212 while pass gate 128 is disabled. At that point, the signal on line 16-n is passed to the input of master stage 122/123. In the subsequent high clock phase, pass gate 126 is disabled while pass gate 128 is enabled. This enables the slave stage 124 to be overwritten with the contents of the master stage 122/123.

The logic for generating signals 212, 214, and 218 is illustrated in FIG. 4. (It is understood that the logic of FIG. 4 is exemplary, and that the signals for controlling the pass gates may be generated by other methods, such as additional logic or programming.) As described above, signal 212 controls the disabling and enabling of pass gate 128. Multiplexer 180, which receives SYSCLK 112-2 and its inverse, is controlled by signal CLK_RPI 112-1. When CLK_RPI is high, signal SYSCLK 112-2 is passed uninverted as signal 210. However, when CLK_RPI is low, signal 210 is the inverse of SYSCLK 112-2. The ability to generate a clock signal and its inverse enables the circuitry to be used with flip-flops that are responsive to either a rising edge or a falling edge of the SYSCLK 112-2 signal.

Signal CLOSE_SLAVE 112-3 and signal 210 (the output of multiplexer 180) serve as inputs to NOR gate 130, and signal 212 is the output thereof. During normal operation, CLOSE_SLAVE 112-3 is low, and thus NOR gate 130 functions effectively as an inverter to signal 210. If CLK_RPI is low, the inverted SYSCLK signal will pass multiplexer 180, and be inverted again as a result of passing through NOR gate 130. When CLK_RPI is high, the uninverted SYSCLK signal is passed by the multiplexer, and inverted once at NOR gate 130. During normal operation, when CLK_RPI is low, signal 212 is identical to SYSCLK, and when CLK_RPI is high, signal 212 is the inverse of SYSCLK.

Signal 218 is fed to pass gate 126 (FIG. 3) and controls the disabling and enabling thereof. Signal 218 is the output of NOR gate 132, for which signal 212, described above, serves a one of three inputs. The other two inputs are CLOSE_MASTER 112-4 and signal 216, which is in turn the output of NOR gate 134 operating on inverted CLK_RPI and inverted CLOSE_SLAVE signals. During normal operation, CLOSE_MASTER and CLOSE_SLAVE are low, so that NOR gate 132 acts as an inverter on signal 212. Consequently, the SYSCLK-related signals to pass gates 126 and 128 are of different polarity during normal operation, i.e. pass gates 126 and 128 are alternately enabled. If pass gate 126 is enabled by signal 218, then pass gate 128 is disabled by the signal 212. Conversely, when pass gate 126 is disabled by the signal 218, pass gate 128 is enabled by signal 212. This makes possible the initial reception of input 16 by each master stage 122/123, and the subsequent transfer of the state of master stage 122/123 to the associated slave stage 124 after SYSCLK is toggled.

Signal 214, which is the output of NAND gate 140, controls the disabling and enabling of pass gate 127. The three inputs to NAND gate 140 are CLOSE_SLAVE 112-3, CLK_RPI 112-1, and the inverse of CLOSE_MASTER 112-4. During normal operation, i.e., when both CLOSE_SLAVE and CLOSE_MASTER are low, signal 214 is high, thus maintaining pass gate 127 in a disabled condition.

To initiate the scanout mode and suspend normal operation of circuit 110, SYSCLK 112-2 is toggled and held to the low condition. CLOSE_MASTER 112-4 is then asserted to change signal 218 to the low condition, and pass gate 126 to master stage 122/123 is disabled. CLOSE_SLAVE 112-3 is subsequently asserted, SO that resulting signal 212 is low and signal 218 is low. Pass gates 126 and 128 are disabled in response to those respective signals. Thus the outputs from any elements on 16-1 through 16-n are not passed on to flip-flops 120/121.

As described above with respect to the embodiment of FIG. 1, additional structure is provided to facilitate the non-destructive scanout process. An inter-register pass gate 134/136 is provided between master stages of adjacent registers 120/121. More particularly, a scan chain is formed as a series of master stages 122/123 having pass gates 134 alternating with pass gates 136 between adjacent master stages. Pass gates 136 are activated by clocking signal SCANCLKA 112-6, while pass gates 134 are activated by clocking signal SCANCLKB 112-8. This permits master stages 122/123 to be coupled in pairs. The coupling process is achieved by alternately enabling and disabling pass gates 134 and 136 in response to SCANCLKA and SCANCLKB.

The process of restoring the state of the flip-flops 120/121 may depend upon the phase of the clock. Restoring the state of the flip-flop is done by deasserting CLOSE_MASTER. This, in turn, determines whether the slave stage 124 has been overwritten with the contents of the master stage 122/123 at the time normal operation is suspended and scanout begins. The original state of each of the flip-flops 120/121 may be restored either from the device input 16-n by enabling pass gate 126, or alternatively, from the slave stage 124 along signal path 129 by enabling pass gate 127. Depending upon whether signal 212 is high or low when scanout begins, pass gate 127 may be either enabled or disabled at that time.

If the phase of clock signal 212 is low when normal operation is suspended and scanout begins, then the slave stage 124 is not yet overwritten with the contents of the master stage 122/123. The slave stage 124 continues to maintain the state from the previous clock iteration, and likewise, output 30-n is unchanged. Pass gate 126 is enabled, so that the master stage 122/123 receives data based on device inputs at 16-n and outputs from the flip-flops 30-n. After scanout (in which both pass gates 126 and 128 are disabled), the master stage 122/123 is restored by re-enabling pass gate 126. Each input 16-n remains constant throughout the scan process and available to restore the master stage of the associated flip-flop 120/121 to its pre-scan state when pass gates 126 are re-enabled.

In contrast, if the phase of clock signal 212 is high when normal operation is suspended and scanout begins, the slave stage 124 has already received data from the master stage 122/123 and has been overwritten. (This occurs, e.g., when SYSCLK is low, signal 212 is high and CLK_RPI is high.) When the slave stage 124 is overwritten, the outputs 30-n are updated as well. As a result, when the scanout process is complete, it may not be possible to restore the master stage 122/123 by enabling pass gate 126. Instead, master stage is restored from the associated slave stage 124 on feedback path 129 by enabling pass gate 127. The restoration process will be described in greater detail below.

After the first restoration, CLOSE_MASTER and CLOSE_SLAVE are returned to high and adjacent flip-flops are re-coupled such that each flip-flop 121 is now the first of each pair, and the contents of the master stages 123 of flip-flops 121 are scanned out, as will be described in greater detail below.

Lastly, the original state of each of the flip-flops 120/121 can be restored again by toggling CLOSE_MASTER and CLOSE_SLAVE to the low condition, thereby enabling the pass gate 126 associated with each master stage 122/123. Normal operation of the circuit can then be resumed.

Operation of the Second Embodiment

The non-destructive scan procedure will now be described in greater detail with respect to an illustrative sequence of timing signals illustrated in FIGS. 5a–5i and 6a–6i, in conjunction with FIGS. 3 and 4. FIGS. 5a–5i and 6a–6i are exemplary, and it is contemplated that other timing sequences may be performed to conduct the scan procedure. FIGS. 5a–5i and 6a–6i are aligned such that signals represented in the FIGS. in the same horizontal position occur simultaneously. FIGS. 5a–5i are illustrative of the scanout procedure when clock signal 212 is low when scanout begins. According to the embodiment of FIGS. 3–4, signal 212 is low when both CLK_RPI is low and SYSCLK is low (FIGS. 5a–5i). Alternatively, signal 212 is low when both CLK_RPI is high and SYSCLK is high (not shown in the FIGS.). FIGS. 6a–6i illustrate scanout when clock signal 212 is high. In the exemplary embodiment, signal 212 is high when CLK_RPI is high and SYSCLK is low (FIGS. 5a–5i). Alternatively, signal 212 is high when CLK_RPI is low and SYSCLK is high (not shown in the FIGS.).

Figure 5:
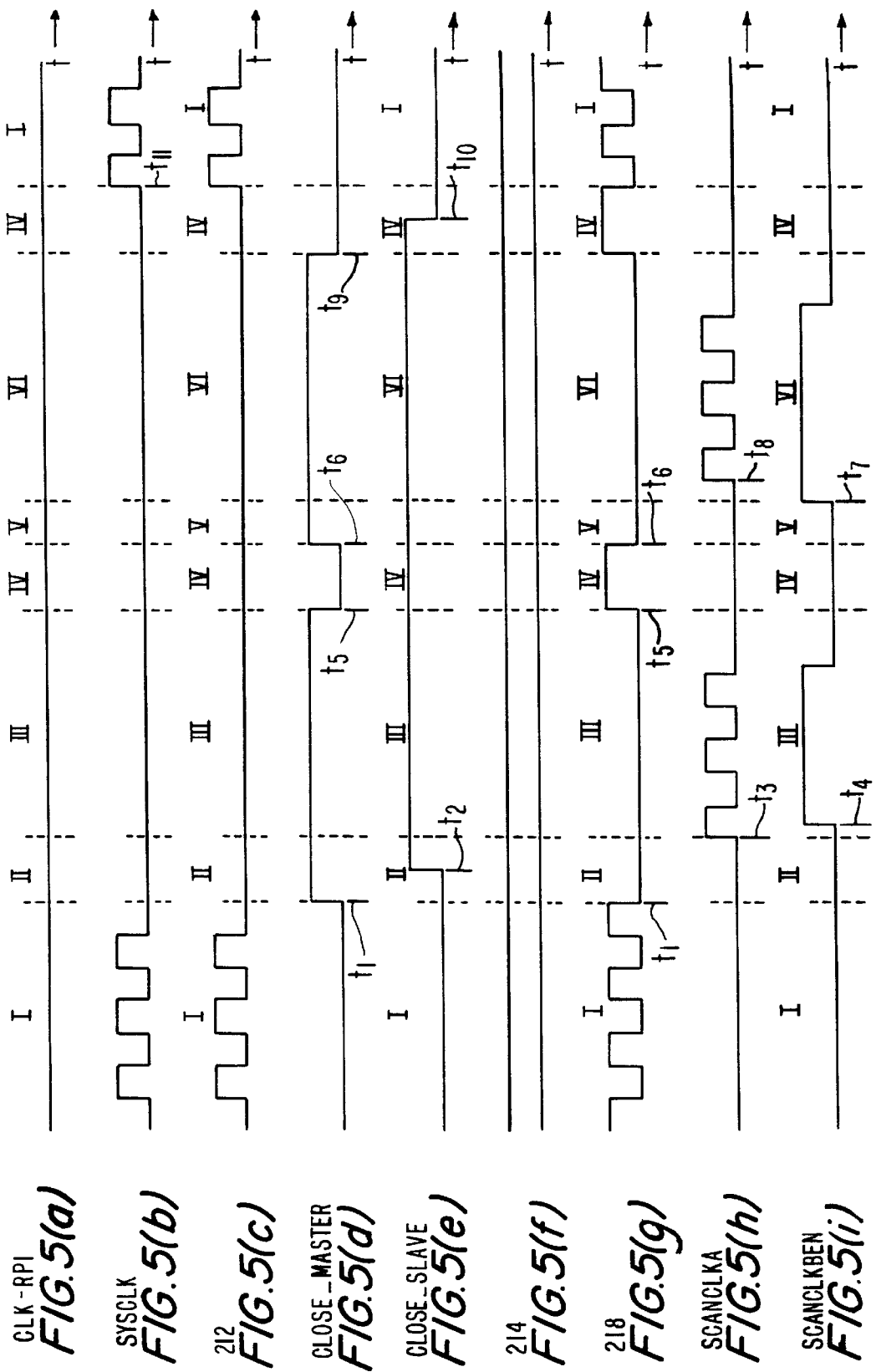
FIG. 5a is a time plot of a control signal sequence in a first logical state in accordance with the embodiments of FIGS. 3–4.
FIG. 5b is a time plot of another control signal sequence in accordance the invention.
FIG. 5c is a time plot of yet another control signal sequence in accordance with the invention.
FIG. 5d is a time plot of an additional control signal sequence in accordance with the invention.
FIG. 5e is a time plot of a fifth control signal sequence in accordance with the invention.
FIG. 5f is a time plot of a sixth control signal sequence in accordance with the invention.
FIG. 5g is a time plot of a seventh control signal sequence in accordance with the invention.
FIG. 5h is a time plot of a eighth control signal sequence in accordance with the invention.
FIG. 5i is a time plot of a ninth control signal sequence in accordance with the invention.

With reference to FIGS. 5a–5i, normal operation is indicated in stage I. The global clock function is supplied by SYSCLK 12-1, and flip-flops 120/121 operate with the adjoining circuit elements as normal. CLOSE_MASTER (FIG. 5d) and CLOSE_SLAVE (FIG. 5e) are both low. Clock signal 212, which controls pass gate 128 is identical to SYSCLK (FIG. 5c). NOR gate 132 operates as an inverter on the signal 212 to produce signal 218, which controls pass gate 126 (FIG. 5g). Signals 212 and 218 are therefore of opposite polarity during normal operation.

NAND gate 140 produces signal 214, which is high during normal operation, such that pass gate 127 is disabled. The SCANCLKBEN (FIG. 5i) and SCANCLKA (FIG. 5h) signals are low. Consequently, the inter-register pass gates 134/136 between adjacent master stages are disabled.

The suspension of normal operation and the initiation of scan testing is represented at stage II of FIGS. 5a–5i. In the example, SYSCLK is deasserted and remains low, and CLK_RPI is low. Thus, clock signal 212 is low at the time scanout begins. (A similar situation results if SYCLK and CLK_RPI are both high.) CLOSE_MASTER is toggled to the high condition at time t1 (FIG. 5d). Consequently, signal 218 (FIG. 5g) is toggled to the low condition, and pass gate 126 is disabled for all flip-flops. Subsequently, CLOSE_SLAVE is toggled to the high condition at time t2 (FIG. 5e). Signal 212 is low and remains low, and therefore pass gate 126 remains disabled. As long as all the master and slave latches are disabled, the outputs 30 of all registers 120/121 remain static, and as a result the inputs 16 to all registers will remain static (again assuming that all inputs to circuit 10 (other than scan control inputs) are held constant).

Subsequently, the scanout procedure for flip-flops 120-1 through 120-n is commenced as indicated in stage III of FIGS. 5a–5i. As with the embodiment described in FIG. 1, two adjacent flop-flips 120/121 form a pair in order to scan data from the first flip-flop 120 of each pair down to the bottom of the chain. As shown in FIGS. 5a–5i, this process is initiated by toggling SCANCLKA high, starting at time t3 (FIG. 5h) before SCANCLKBEN is toggled to the high condition. SCANCLKBEN is toggled shortly thereafter at t4 (FIG. 5i).

During this scanout process, the contents of master stage 122 of the first flip-flop 120 of each S pair is passed to the master stage 123 of the second flip-flop 121 of the pair. In effect, master stage 123 of flip-flop 121 temporarily acts as a slave stage to master stage 122 of flip-flop 120. SCANCLKA is toggled while SCANCLKBEN remains high. As SCANCLKA is toggled, data from flip-flops 120 is passed vertically downward and scanned out (via element 40) at the bottom of the chain (see FIG. 3).

The next step in the non-destructive scanout procedure is the recovery of the initial state as illustrated in stage IV in FIGS. 5a–5i. SYSCLK remains low during this stage (FIG. 5b). Since no data is being scanned out, SCANCLKA and SCANCLKBEN are both low. CLOSE_MASTER is toggled from high to low at time t5 (FIG. 5d), but CLOSE_SLAVE remains high (FIG. 5e). All pass gates 126 are re-enabled, while pass gates 128 and 127 remain disabled. Consequently, the initial state of all master stages 122/123 is recovered from the input at 16-n.

The scanout procedure for flip-flops 121-1 through 121-n is now initiated as indicated in stage V of FIGS. 5a–5i. During this stage, flip-flops 120/121 are again paired. However, in this case, master stage 122 of each flip-flop 120 temporarily acts as a slave stage to master stage 123 of each flip-flop 121 to permit scanning of data from the master stages 123 of flip-flops 121. CLOSE_MASTER is toggled back from low to high to disable pass gates 126 at time t6 (FIGS. 5d–5g).

To begin scanout at stage VI, SCANCLKBEN is asserted at time t7 before SCANCLKA (FIG. 2d), in contrast with scanout at stage III, described above. (SCANCLKA is toggled shortly thereafter at time t8.) As a result, data in the master stage 123 of each first flip-flop 121 in the pair of flip-flops 120/121 is passed to the master stage 122 of the second flip-flop 120 of the pair. Thus, the contents of the master stage 122 of flip-flop 120 are overwritten by the master stage 123 of flip-flop 121. As in stage III, described above, SCANCLKA is toggled while SCANCLKBEN remains high. As SCANCLKA is toggled, data from flip-flops 21 is passed vertically downward. This data may be scanned out at the bottom of the chain.

The recovery stage, again referred to as stage IV in FIGS. 5a–5i, recovers the initial state of the machine during normal operation in stage I prior to commencement of the scanout process. Once the data from flip-flops 121 have been scanned out, SCANCLKA and SCANCLKBEN remain in the low condition. The initial state is recovered by toggling CLOSE_MASTER from the high to the low condition at time t9 (FIG. 5d). Consequently, pass gates 126 are re-enabled. CLOSE_SLAVE is toggled to the low condition at time t10 (FIG. 5e). Once the initial state is recovered, normal operation may continue, as indicated by the resumption of SYSCLK at time t10 (FIG. 5b).

Figure 6:
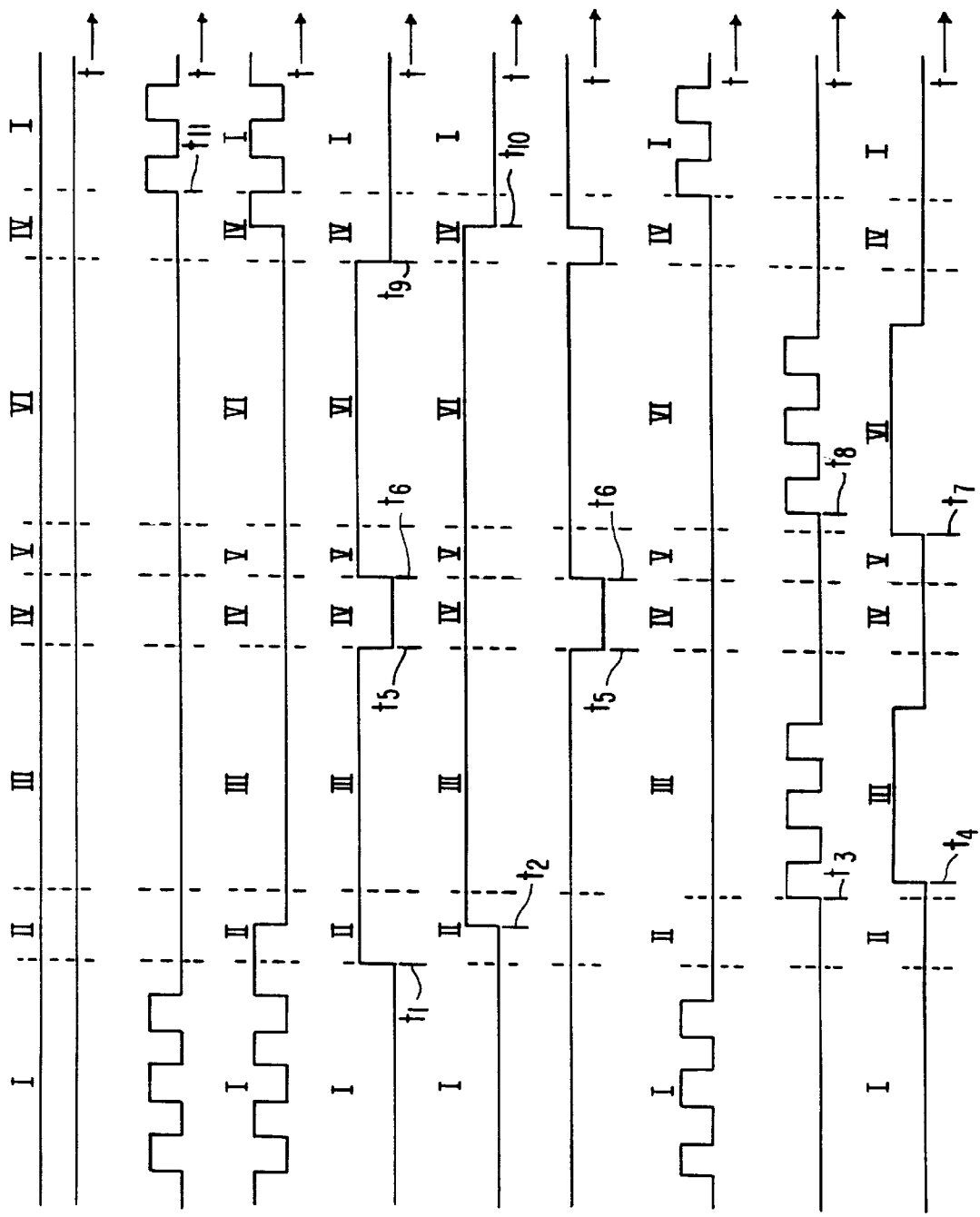
FIG. 6a is a time plot of a control signal sequence in a second logical state in accordance with the embodiments of FIGS. 3–4.
FIG. 6b is a time plot of another control signal sequence in accordance the invention.
FIG. 6c is a time plot of yet another control signal sequence in accordance with the invention.
FIG. 6d is a time plot of an additional control signal sequence in accordance with the invention.
FIG. 6e is a time plot of a fifth control signal sequence in accordance with the invention.
FIG. 6f is a time plot of a sixth control signal sequence in accordance with the invention.
FIG. 6g is a time plot of a seventh control signal sequence in accordance with the invention.
FIG. 6h is a time plot of a eighth control signal sequence in accordance with the invention.
FIG. 6i is a time plot of a ninth control signal sequence in accordance with the invention.

Operation of circuit 110 will now be described for situations when clock signal 212 is high when scanout begins. Comparison of FIGS. 5a–5i with FIGS. 6a–6i will readily illustrate that inputs SYSCLK, CLOSE_MASTER, CLOSE_SLAVE, SCANCLKA, and SCANCLKBEN are identical regardless of whether CLK_RPI is high or low. However, toggling CLK_RPI from low to high will affect signals 212, 214, and 218 and therefore which pass gates 126, 127 are enabled to restore flip-flops 120/121. Normal operation is shown in stage I of FIGS. 6a–6i. Signal 212, which controls pass gate 128 is the inverse of SYSCLK (FIG. 6c). This permits falling-edge triggered flip-flops to be incorporated into the circuit 110. Signals 212 and 218 are of opposite polarity during normal operation. NAND gate 140 produces signal 214, which is high during normal operation, such that pass gate 127 is disabled. Pass gates 134 and 136 between adjacent master stages are disabled during normal operation because SCANCLKBEN (FIG. 6i) and SCANCLKA (FIG. 6h) signals are low.

The initiation of scan testing is represented at stage II of FIGS. 6a–6i. SYSCLK is deasserted and remains low, signal 212 is high, and signal 218 is low. Pass gate 128 is thus enabled, such that the slave stage 124 is overwritten with the state of the master stage 122/123, and outputs 30-n are updated. CLOSE MASTER is toggled to the high condition at time t1(FIG. 6d), such that signal 218 remains in the low condition (FIG. 6g), and pass gate 126 is disabled. CLOSE_SLAVE is then toggled to the high condition at time t2 (FIG. 6e), which changes signal 212 to the low condition, and therefore disables pass gate 128.

The scanout procedure for flip-flops 120-1 through 120-n is commenced as indicated in stage III of FIGS. 6a–6i. This process, as described above, is initiated by toggling SCANCLKA high, starting at time t3 (FIG. 6h) before SCANCLKBEN is toggled to the high condition at time t4 (FIG. 6i). As SCANCLKA is toggled, data from flip-flops 120 is passed vertically downward and scanned out (via element 40) at the bottom of the chain (see FIG. 3).

The recovery of the initial state is illustrated in stage IV in FIGS. 6a–6i. SYSCLK remains low during this stage (FIG. 6b); SCANCLKA (FIG. 6h) and SCANCLKBEN (FIG. 6i) are also low. CLOSE_MASTER is toggled from high to low at time t5 (FIG. 6d), but CLOSE_SLAVE remains high (FIG. 6e). The logic, described with respect to FIG. 3, produces a low signal 214 for low CLOSE_MASTER. Therefore, pass gates 127 are re-enabled, while pass gates 126 and 128 remain disabled. Consequently, the initial state of all master stages 122/123 is recovered from slave stage 124 via line 129.

The scanout procedure for flip-flops 121-1 through 121-n is now initiated as indicated in stage V of FIGS. 6a–6i. CLOSE_MASTER is toggled back from low to high to disable pass gates 127 at time t6 (FIGS. 6d–6g). During this stage, flip-flops 120/121 are again paired. However, in this case, master stage 122 of each flip-flop 120 temporarily acts as a slave stage to master stage 123 of each flip-flop 121 to permit scanning of data from the master stages 123 of flip-flops 121.

To begin scanout at stage VI, SCANCLKBEN is asserted at time t7 (FIG. 6j) before SCANCLKA at time t8 (FIG. 2d). As a result, data in the master stage 123 of each first flip-flop 121 in the pair of flip-flops 120/121 is passed to the master stage 122 of the second flip-flop 120 of the pair. Thus, the contents of the master stage 122 of flip-flop 120 are overwritten by the master stage 123 of flip-flop 121. As in stage III, described above, SCANCLKA is toggled while SCANCLKBEN remains high. As SCANCLKA is toggled, data from flip-flops 121 is passed vertically downward. This data may be scanned out at the bottom of the chain.

The recovery stage, again referred to as stage IV in FIGS. 6a–6i, restores the initial state of the machine during normal operation in stage I prior to commencement of the scanout process. Once the data from flip-flops 121 have been scanned out, SCANCLKA and SCANCLKBEN remain in the low condition. The initial state is recovered by toggling CLOSE_MASTER from the high to the low condition at time t9 (FIG. 6d). Consequently, signal 214 is low, and pass gates 127 are re-enabled. Once the initial state is restored, CLOSE_SLAVE is toggled to the low condition at time t10 (FIG. 6e), thereby changing signal 212 to the high condition, disabling pass gate 127. Normal operation may continue, as indicated by the resumption of SYSCLK at time t11 (FIG. 6b).

Figure 7:
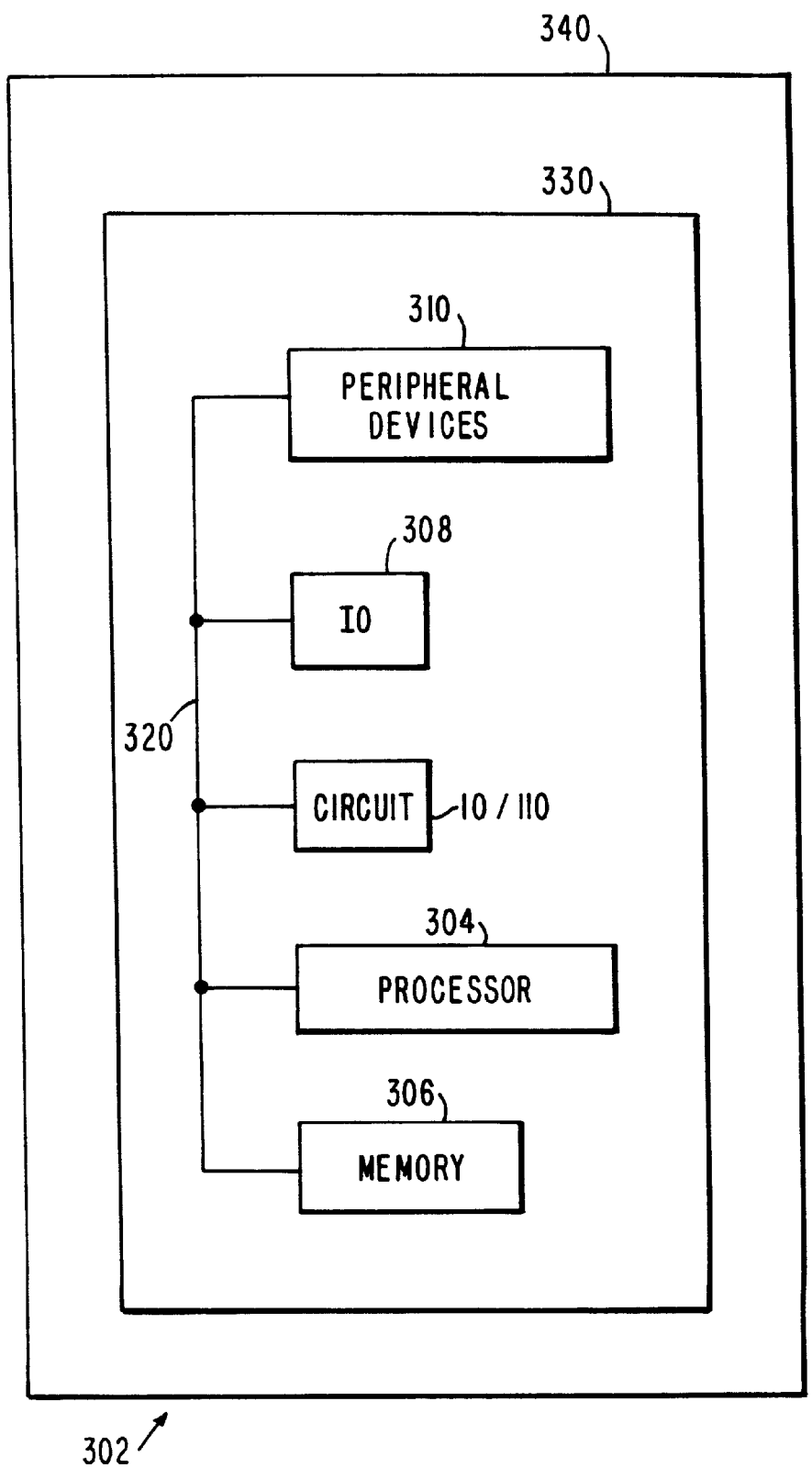
FIG. 7 is a simplified block diagram of an illustrative system employing a circuit in accordance with the invention.

FIG. 7 illustrates a circuit 10/110 of this invention in a data processing system 302. Data processing system 302 may include one or more of the following components: a processor 304; memory 306; I/O circuitry 308; and peripheral devices 310. These components are coupled together by a system bus 320 and are populated on a circuit board 330 which is contained in an end-user system 340.

System 302 can be used in a wide variety of applications, such as computer networking, data networking, instrumentation, video processing, digital signal processing, or any other application where the advantage of using programmable or reprogrammable logic is desirable. Circuit 10/110 (which can, for example, be a programmable logic device) can be used to perform a variety of different functions. For example, circuit 10/110 can be a processor or controller that works in cooperation with processor 304. Circuit 10/110 may also be used as an arbiter for arbitrating access to a shared resource in system 302. In yet another example, circuit 10/110 can be configured as an interface between processor 304 and one of the other components in system 302. It should be noted that system 302 is only exemplary, and that the true scope and spirit of the invention should be indicated by the following claims.

It will be understood that the foregoing is only illustrative of the principles of this invention, and that various modifications can be made by those skilled in the art without departing from the scope and spirit of the invention. For example the scanout of master stages 23/123 in stage VI above may be conducted prior to the scanout of master stages 22/122 in stage III.

What is claimed is:

1. An electronic circuit comprising:
   a plurality of register circuits, each including an input gate configured to selectively pass a data signal applied to that register, a master stage configured to store a data signal passed by the input gate of that register, an interstage gate configured to selectively pass a data signal stored by the master stage of that register, and a slave stage configured to store a data signal passed by the interstage gate of that register;
   a plurality of inter-register gates, each of which is operatively arranged to selectively pass a data signal stored by the master stage of an associated respective first one of the registers to the master stage of an associated respective second one of the registers for storage by the master stage of that second one of the registers so that the master stages of all of the registers and the inter-register gates are connected in a single series of alternating master stages and inter-register gates;
   normal mode circuitry configured to alternately enable the input gates and the interstage gates and to disable the inter-register gates; and
   scan mode circuitry configured to disable the input gates and the interstage gates and to alternately enable alternate ones of the inter-register gates in the series.

2. The circuit defined in claim 1 wherein the scan mode circuitry is further configured to enable alternate ones of the inter-register gates beginning with either one of two adjacent inter-register gates in the series.

3. The circuit defined in claim 1 wherein each of the registers further includes:
   a feedback gate configured to selectively pass a data signal stored by the slave stage of that register to the master stage of that register for storage by that master stage.

4. The circuit defined in claim 3 wherein the scan mode circuitry is further configured to enable the feedback gates while disabling the input gates, the interstage gates, and the inter-register gates.

5. A digital processing system comprising:
   processing circuitry;
   memory circuitry coupled to said processing circuitry; and
   a circuit coupled to the processing circuitry and the memory circuitry, the circuit comprising
      a plurality of register circuits, each including an input gate configured to selectively pass a data signal applied to that register, a master stare configured to store a data signal passed by the input gate of that register, an interstate gate configured to selectively pass a data signal stored by the master stage of that register, and a slave stage configured to store a data signal passed by the interstate gate of that register;
      a plurality of inter-register gates, each of which is operatively arranged to selectively pass a data signal stored by the master stage of an associated respective first one of the registers to the master stage of an associated respective second one of the registers for storage by the master stage of that second one of the registers so that the master stages of all of the registers and the inter-register gates are connected in a single series of alternating master stages and inter-register gates;
      normal mode circuitry configured to alternately enable the input gates and the interstate gates and to disable the inter-register gates; and
      scan mode circuitry configured to disable the input gates and the interstate gates and to alternately enable alternate ones of the inter-register gates in the series.

6. A printed circuit board on which is mounted a circuit, the circuit comprising
   a plurality of register circuits, each including an input gate configured to selectively pass a data signal applied to that register, a master stare configured to store a data signal passed by the input gate of that register, an interstate gate configured to selectively pass a data signal stored by the master stage of that register, and a slave stage configured to store a data signal passed by the interstate gate of that register;
   a plurality of inter-register gates, each of which is operatively arranged to selectively pass a data signal stored by the master stare of an associated respective first one of the registers to the master stage of an associated respective second one of the registers for storage by the master stare of that second one of the registers so that the master stages of all of the registers and the inter-register gates are connected in a single series of alternating master stages and inter-register gates;
   normal mode circuitry configured to alternately enable the input gates and the interstate gates and to disable the inter-register gates; and
   scan mode circuitry configured to disable the input gates and the interstate gates and to alternately enable alternate ones of the inter-register gates in the series.

7. The printed circuit board defined in claim 6 further comprising:
   memory circuitry mounted on the printed circuit board and coupled to the circuit.

8. The printed circuit board defined in claim 6 further comprising:
   processing circuitry mounted on the printed circuit board and coupled to the circuit.

9. An electronic circuit comprising:
   a plurality of register circuits, each including an input gate configured to selectively pass a data signal applied to that register, a master stage configured to store a data signal passed by the input gate of that register, an interstage gate configured to selectively pass a data signal stored by the master stage of that register, a slave stage configured to store a data signal passed by the interstage gate of that register, and a feedback gate configured to selectively pass a data signal stored by the slave stage of that register to the master stage;
   a plurality of inter-register gates, each of which is operatively arranged to selectively pass a data signal stored by the master stage of an associated respective first one of the registers to the master stage of an associated respective second one of the registers for storage by the master stage of that second one of the registers so that the master stages of all of the registers and the inter-register gates are connected in a single series of alternating master stages and inter-register gates;
   normal mode circuitry configured to alternately enable the input gates and the interstage gates and to disable the inter-register gates and feedback gates;
   scan mode circuitry configured to disable the input gates, the interstage gates, and the feedback gates and to alternately enable alternate ones of the inter-register gates in the series; and restoration mode circuitry configured to selectively enable one of the input gates and the feedback gates and to disable the interstage gates and the inter-register gates.

10. The circuit defined in claim 9 wherein the restoration mode circuitry further includes:

circuitry for selecting between the input gates and the feedback gates.

11. The circuit defined in claim 9 wherein the restoration circuitry further includes:

circuitry for selecting between the input gates and the feedback gates based upon the phase of a clock signal.

12. A digital processing system comprising:

processing circuitry;

memory circuitry coupled to said processing circuitry; and a circuit coupled to the processing circuitry and the memory circuitry comprising a plurality of register circuits, each including an input gate configured to selectively pass a data signal applied to that register, a master stage configured to store a data signal passed by the input gate of that register, an interstate gate configured to selectively pass a data signal stored by the master stage of that register, a slave stage configured to store a data signal passed by the interstage gate of that register, and a feedback gate configured to selectively pass a data signal stored by the slave stage of that register to the master stage;

a plurality of inter-register gates, each of which is operatively arranged to selectively sass a data signal stored by the master stage of an associated respective first one of the registers to the master stare of an associated respective second one of the registers for storage by the master stare of that second one of the registers so that the master stages of all of the registers and the inter-register gates are connected in a single series of alternating master stages and inter-register gates;

normal mode circuitry configured to alternately enable the input gates and the interstate gates and to disable the inter-register gates and feedback gates;

scan mode circuitry configured to disable the input gates, the interstate gates, and the feedback gates and to alternately enable alternate ones of the inter-register gates in the series; and restoration mode circuitry configured to selectively enable one of the input gates and the feedback gates and to disable the interstate gates and the inter-register gates.

13. A printed circuit board on which is mounted a circuit, the circuit comprising a plurality of register circuits, each including an input gate configured to selectively pass a data signal applied to that register, a master stage configured to store a data signal passed by the input gate of that register, an interstage gate configured to selectively Pass a data signal stored by the master stage of that register, a slave stage configured to store a data signal passed by the interstate gate of that register, and a feedback gate configured to selectively pass a data signal stored by the slave stage of that register to the master stage;

a plurality of inter-register gates, each of which is operatively arranged to selectively pass a data signal stored by the master stare of an associated respective first one of the registers to the master stage of an associated respective second one of the registers for storage by the master stage of that second one of the registers so that the master stages of all of the registers and the inter-register gates are connected in a single series of alternating master stages and inter-register gates;

normal mode circuitry configured to alternately enable the input gates and the interstate gates and to disable the inter-register gates and feedback gates;

scan mode circuitry configured to disable the input gates, the interstate gates, and the feedback gates and to alternately enable alternate ones of the inter-register gates in the series; and restoration mode circuitry configured to selectively enable one of the input gates and the feedback gates and to disable the interstate gates and the inter-register gates.

14. The printed circuit board defined in claim 13 further comprising:

memory circuitry mounted on the printed circuit board and coupled to the circuit.

15. The printed circuit board defined in claim 13 further comprising:

processing circuitry mounted on the printed circuit board and coupled to the circuit.

16. A method for scan testing electronic circuitry comprising:

providing a plurality of register circuits, each including an input gate configured to selectively pass a data signal applied to that register, a master stage configured to store a data signal passed by the input gate of that register, an interstage gate configured to selectively pass a data signal stored by the master stage of that register, and a slave stage configured to store a store a data signal passed by the interstage gate of that register;

providing a plurality of inter-register gates, each of which is operatively arranged to selectively pass a data signal stored by the master stage of an associated respective first one of the registers to the master stage of an associated respective second one of the registers for storage by the master stage of that second one of the registers so that the master stages of all of the registers and the inter-register gates are connected in a single series of alternating master stages and inter-register gates;

alternately enabling the input gates and the interstage gates and disabling the inter-register gates; and disabling the input gates and the interstage gates and alternately enabling alternate ones of the inter-register gates in the series.

17. The method recited in claim 16, wherein each of the registers is provided with a feedback gate configured to selectively pass a data signal stored by the slave stage of that register to the master stage of that register for storage by that master stage, said method further comprising:

enabling the feedback gates while disabling the input gates, the interstage gates, and the inter-register gates.

18. The method recited in claim 16, wherein each of the registers is provided with a feedback gate configured to selectively pass a data signal stored by the slave stage of that register to the master stage of that register for storage by that master stage, said method further comprising:

selectively enabling one of the feedback gates and the input gates while disabling the interstage gates and the inter-register gates.

19. The method recited in claim 18, wherein the step of disabling the input gates and the interstage gates further includes:

storing the phase of a clock signal.

20. The method recited in claim 19, wherein the step of selectively enabling one the feedback gates and the input gates includes:

selecting one of the feedback gates and the input gates based on the phase of the clock signal.

* * * * *